United States Patent [19]
Fuesser et al.

[11] Patent Number: 5,817,407
[45] Date of Patent: Oct. 6, 1998

[54] ORGANIC LAYER FOR SUBSEQUENT COATING WITH A COVER LAYER WHICH IS HARDER THAN THE ORGANIC LAYER AND PROCESS FOR SURFACE TREATMENT OF AN ORGANIC LAYER

[75] Inventors: Hans-Juergen Fuesser, Gerstetten; Karl Holdik, Beimerstetten; Klaus Rohwer, Ulm; Martin Hartweg, Erbach, all of Germany

[73] Assignee: Daimler-Benz AG, Stuttgart, Germany

[21] Appl. No.: 797,557

[22] Filed: Feb. 6, 1997

Related U.S. Application Data

[62] Division of Ser. No. 499,323, Jul. 7, 1995, Pat. No. 5,628,920.

[30] Foreign Application Priority Data

Jul. 7, 1994 [DE] Germany ............... 44 23 833.9

[51] Int. Cl.⁶ .................................. B32B 7/02
[52] U.S. Cl. ................... 428/217; 428/212; 428/408
[58] Field of Search .................. 428/408, 217, 428/212

[56] References Cited

U.S. PATENT DOCUMENTS

| | | | |
|---|---|---|---|
| 4,975,328 | 12/1990 | Hirose et al. ................... | 428/413 |
| 5,211,995 | 5/1993 | Kuehnle et al. ................. | 427/570 |
| 5,223,765 | 6/1993 | Staron et al. ................... | 313/478 |
| 5,656,363 | 8/1997 | Fuesser et al. .................. | 428/408 |

FOREIGN PATENT DOCUMENTS

| | | |
|---|---|---|
| 598 361 | 5/1994 | European Pat. Off. . |
| 3832111 a1 | 4/1989 | Germany . |

OTHER PUBLICATIONS

Kaufer, Arbeiten mit Kunststoffen (Working with Plastics), vol. 1, p. 145, Springer–Verlag, Berlin (1978). (Month Unknown).

Weighelt, "Auf die Anwendung zugesschnittene Eigenschaften", (Properties Cut to Fit the Application), Plastverabeiter (Plastics Processor), vol. 37, No. 2, pp. 112–114, (1986). (Month Unknown).

*Primary Examiner*—Archene Turner
*Attorney, Agent, or Firm*—Evenson, McKeown, Edwards & Lenahan, PLLC

[57] ABSTRACT

An organic layer for subsequent coating with a cover layer which is harder than the organic layer, and a process for surface treatment of the organic layer. In order to improve the quality of a subsequently applied cover layer, growth nuclei for the cover layer, which exhibit $sp^2$ and/or $sp^3$ bonding orbital hybridization, are arranged and/or exposed on the free surface of the organic layer.

3 Claims, 2 Drawing Sheets

ORGANIC LAYER FOR SUBSEQUENT COATING WITH A COVER LAYER WHICH IS HARDER THAN THE ORGANIC LAYER AND PROCESS FOR SURFACE TREATMENT OF AN ORGANIC LAYER

This application is a division of application Ser. No. 08,499,323, filed Jul. 7, 1995, now U.S. Pat. No. 5,628,920.

BACKGROUND OF THE INVENTION

The invention relates to an organic layer for subsequent coating with a cover layer which is harder than the organic layer. The invention also relates to a process for surface treatment of an organic layer which is intended to be subsequently coated with a cover layer which is harder than the organic layer.

Kuehnle et al., U.S. Pat. No. 5,211,995 discloses a process for coating organic surfaces with a cover layer which is harder than the organic layer. In this process the organic layer, in particular a clear finish lacquer of organic material on a metal sheet painted with colored lacquer is prepared for application of the cover layer by a cleaning operation. Subsequently, the prepared organic layer, which may, for example, be a clear final lacquer of a metal sheet or panel painted with colored lacquer, has the cover layer formed of material which is harder than the organic layer deposited thereon by means of the CVD (Chemical Vapor Deposition) process. For this purpose, the surface of the organic layer is cleaned, introduced into a reactor, the reactor is evacuated, a gas comprising a precursor material—referred to hereinafter as precursor material—is introduced, and the precursor material is energetically excited. When the process parameters are appropriately adjusted, the cover layer then deposits on the surface of the organic layer, i.e. on the clear lacquer. The material of the color layer may be, in particular, silicon nitride ($Si_3N_4$) and titanium nitride ($TiN_2$). Cover layers of this type theoretically are particularly useful in the automobile field, since the cover layers exhibit substantial resistance against external, destructive influences, such as, for example, chemicals or mechanical stresses, i.e. scratches and the like. Furthermore, when a motor vehicle body is successfully coated, it is possible to omit supplemental waxing of the motor vehicle body, which is comparatively costly in financial terms and which also is associated with environmental costs during application and subsequent removal of the wax layer. It has proven to be problematic, however, that the quality of the overall layer construction consisting of an organic layer and a cover layer, is low. Thus, a layer construction of this type, for example, does not exhibit an optically uniform coloration, and the surface quality also is low. Furthermore, the resistance of the cover layer against chemical influences which further attack the organic layer and against possible mechanical influences, under which the cover layer, for example, fractures, remains far below the theoretically achievable protection of the organic layer.

SUMMARY OF THE INVENTION

It is the object of the invention to enable the application of a cover layer on an organic layer, whereby the completed layer construction comprising an organic layer and a cover layer, exhibits the best possible optical quality and the best possible protective effect of the cover layer which is to be applied.

A further object of the invention is to provide a process for applying a cover layer over an organic layer.

The objects are achieved in accordance with a first aspect of the invention by providing an organic layer for subsequent coating with a cover layer which is harder than the organic layer, in which the organic layer has an exposed surface provided with growth nuclei for the cover layer which is subsequently to be applied, and in which the growth nuclei exhibit $sp^2$ or $sp^3$ bonding orbital hybridization for elements of the cover layer.

In accordance with a further object of the invention, the objects are achieved by providing a process for surface treatment of an organic layer to prepare the organic layer for subsequent coating with a cover layer which is harder than the organic layer, comprising providing growth nuclei for the cover layer on the surface of the organic layer, the growth nuclei being formed of material which exhibits $sp^2$ or $sp^3$ bonding orbital hybridization for elements of the cover layer.

By means of the application and/or the exposure of growth nuclei for the cover layer which are associated with the organic layer, the cover layer subsequently can be grown with sufficient uniformity and at a sufficiently high growth rate. In this way both the optical quality and the adhesion of the cover layer to the organic layer are improved. At the same time, the cover layer grows to cover the surface more densely, which decreases the possibility of attack by chemicals, for example by penetration into scratches and cracks in the cover layer.

Advantageous further embodiments and features of the invention will be apparent from the following description.

BRIEF DESCRIPTION OF THE DRAWINGS

The invention will be described in further detail hereinafter with reference to illustrative preferred embodiments shown in the accompanying drawings in which.

DETAILED DESCRIPTION OF PREFERRED EMBODIMENTS

Figure 1:
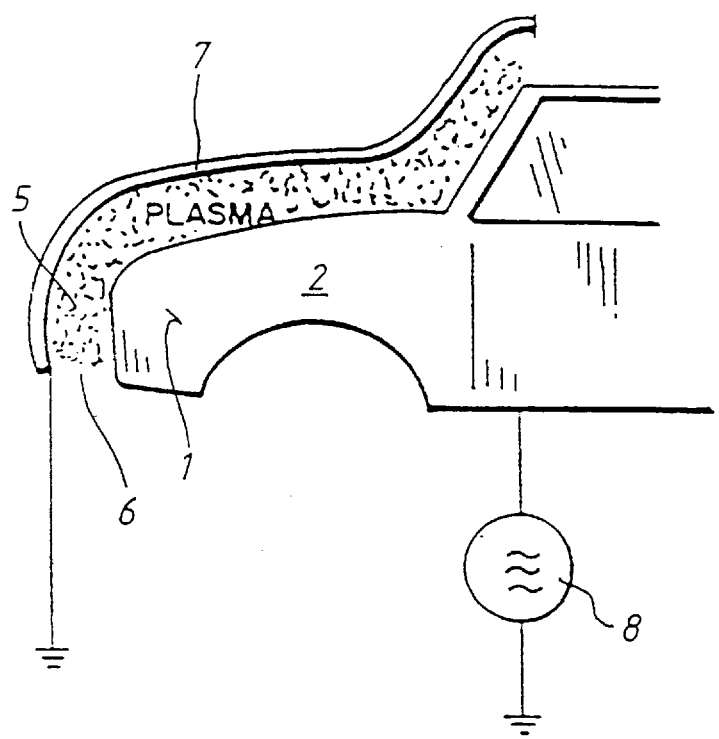
FIG. 1 shows an apparatus for carrying out the surface treatment of the organic layer.

FIG. 1 depicts an apparatus for carrying out a surface treatment in accordance with the invention of an organic layer 2, which in the present example is a clear lacquer on a painted metal sheet or panel 9 of a vehicle body. The apparatus, which is constructed in the manner of CVD (Chemical Vapor Deposition) apparatus, comprises a reactor which is preferably evacuable. In the present case, the wall 7 of the reactor is advantageously formed to correspond to the surface contour of the organic layer 2, whereby when the organic layer is positioned in the reactor, it is held approximately equidistant from the wall 7. In place of the wall 7 of the reactor, an electrode (not shown), which is likewise formed to correspond to the contour of the organic layer 2, can also be mounted inside the reactor arranged so as to be spaced equidistantly from the organic layer 2.

By evacuating the interior of the reactor, the normal air, which comprises oxygen and other possibly disturbing elements, is removed from the vicinity relevant to the deposition of a cover layer 4. In conjunction therewith, the evacuation of the interior can be continued or repeated as needed in order to maintain a low pressure, or the evacuated interior can be filled with a desired gas. This depends on the desired process parameters for the deposition of the cover layer 4. Thus, for example, an advantageous nucleation of the exposed surface 1 of the organic layer 2 (i.e. a production of growth nuclei 3 on the exposed surface 1), which is to be undertaken prior to the deposition of the cover layer 4, may require the presence of a specific process gas in the vicinity of the deposition surface.

Furthermore, the apparatus comprises a voltage source 8 by means of which the part, which is to be surface treated, can be raised to an electrical potential which differs from zero.

In order to produce a surface treated organic layer 2, for example, a metal sheet or panel 9 which carries an organic layer 2 in the form of a clear lacquer covering a colored base lacquer, is introduced into the reactor. The panel 9 is thereby mounted in such a way that the exposed surface 1 of the organic layer 2 lies opposite the reactor wall 7, which forms one electrode, and the organic layer also exhibits a uniform spacing from the reactor wall 7. In the reactor, the exposed surface 1 is provided with growth nuclei 3 for the cover layer 4, whereby the growth nuclei 3 comprise materials which exhibit an $sp^2$ and/or an $sp^3$ hybridization of the bonding orbitals for the elements of the cover layer 4 subsequently deposited on the exposed surface 1.

In order to achieve a uniform application of the cover layer 4 which is subsequently to be applied on top of the exposed surface 1, it is desirable to distribute the growth nuclei 3 substantially uniformly over the surface of the exposed surface 1.

If a layer of diamond and/or of a diamond-like material is to be deposited as the cover layer 4, then adamantane and/or congressane and/or organic molecules which contain corresponding homologs of the series of $sp^2$ hybridizing carbon agglomerates are advantageously used as growth nuclei 3.

In principle, the organic layer 2 can be provided with growth nuclei 3 in two ways. First, the growth nuclei 3 can be deposited from an external source on the organic layer. Alternately, the growth nuclei can contained within the organic layer 2 and subsequently exposed.

The arrangement of the growth nuclei 3 on the organic layer 2 can be achieved, for example, by mechanically rubbing a powder into the organic layer 2, whereby the powder consists of the material which forms the growth nuclei 3. In this regard, the typical particle sizes of the powder lie in the $\mu$m region or below.

Another possibility for arranging the growth nuclei 3 on the organic layer 2 is to deposit the growth nuclei 3 on the organic layer 2 in the reactor by means of a CVD-like process. Prior to the deposition of growth nuclei 3 on the organic layer 2, it is advantageous to remove contaminants such as oxides and the like found on the organic layer 2. This can be effected, in particular, by means of plasma cleaning. In the reactor the growth nuclei 3 are deposited from a gas phase 6 which comprises a precursor material 5. In order to improve the deposition of the growth nuclei 3 on the organic layer 2, it is desirable to apply a negative electric potential to the organic layer 2 by means of a voltage source 8. This electric potential can amount up to −500 V, in particular up to −300 V, relative to the gas phase 6 which is to be deposited. Furthermore, it is advantageous to energetically excite the precursor material 5 found in the gas phase 6. This excitation can be effected by means of electromagnetic radiation, in particular by means of microwave and/or high frequency (radio frequency) energy and/or by arc discharge and/or by any other type of plasma excitation. As precursor materials 5 for the growth nuclei 3, materials having a composition corresponding to the formula:

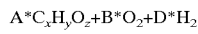

have proved suitable, wherein:
x=1 to 3,
y=4 to 8,
z=0 to 2, and
A+B+D=100%.

As previously mentioned, the organic layer 2 can also be provided with growth nuclei 3 by exposure of growth nuclei 3 from within the organic layer 2. In this case, the organic layer 2 comprises the growth nuclei 3, for example, as mixed-in components of the lacquer. In conjunction with this, it is not necessary for the growth nuclei 3 found within the organic layer 1 to be present in their final molecular structure. Instead they may be initially present within the organic layer in a form which can be more easily mixed into the organic layer 2, since in this way molecules can be utilized which are chemically or physically passive with respect to the materials of the organic layer 2. When the growth nuclei 3 subsequently are exposed from within the organic layer 1, they also can be freed from side groups or other substituents which are still arranged thereon. The exposure of the growth nuclei can be effected during cleaning of the exposed surface 1 by wet chemical etching. If a reactor, for example corresponding to FIG. 1, is utilized, then the exposure can also be effected during plasma cleaning of the exposed surface 1.

In order to surface treat the organic layer 1, it may be desirable in principle to combine the procedure for exposing the growth nuclei 3 and the procedure for arranging the growth nuclei 3 for the deposition process with each other.

Figure 2:
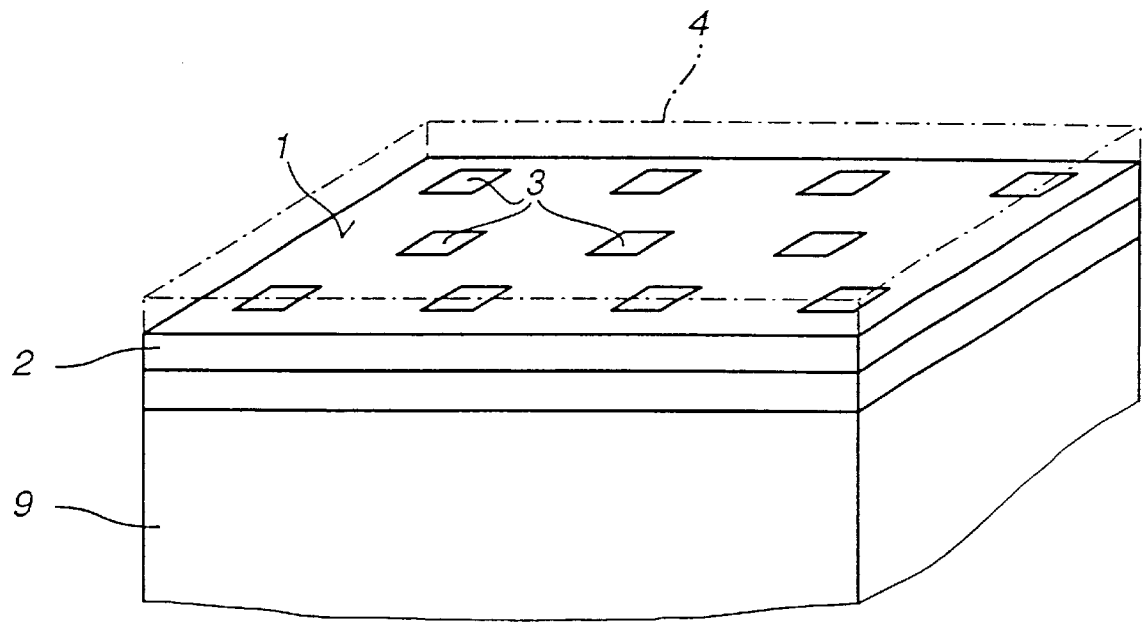
FIG. 2 shows a lacquered metal sheet or panel in which a clear lacquer which covers the colored lacquer forms the organic layer.

FIG. 2 illustrates a possible layer construction with an organic layer 2 treated in accordance with the invention. The layer construction according to FIG. 2 comprises a panel 9 which has been painted on a flat surface thereof with a colored base lacquer. On top of the base lacquer a clear lacquer, which forms the organic layer 2, is deposited. The clear lacquer is provided with growth nuclei 3 on its exposed surface 1. The growth nuclei 3 are intended for a cover layer 4 (shown by broken lines) which is to be arranged on the exposed surface 1 of the organic layer 2. The nuclei preferably exhibit an $sp^2$ and/or an $sp^3$ hybridization of their bonding orbitals with respect to the cover layer 4, whereby they are particularly suited for cover layers 4 which are produced of diamond and/or of diamond-like materials.

Figure 3:
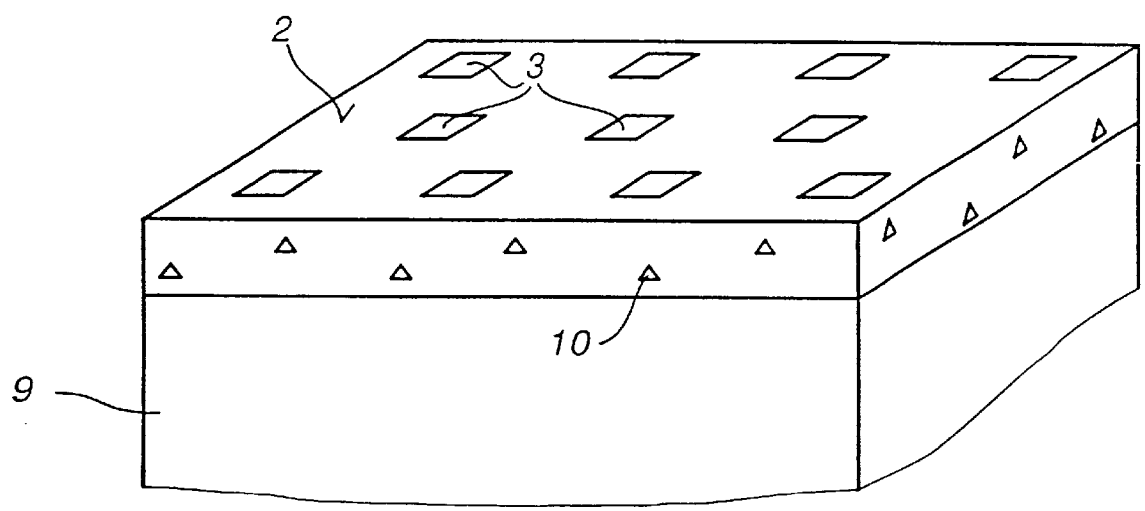
FIG. 3 shows a lacquered panel in which the colored lacquer forms the organic layer.

In FIG. 3 a further possible layer construction is illustrated with an organic layer 2 which likewise is treated in accordance with the invention. The difference between this layer construction and the working embodiment according to FIG. 2 is that in this layer construction the base lacquer, which advantageously can be provided with substances which act as color centers 10, forms the organic layer 2 and is directly provided with the growth nuclei 3.

Particularly in clear lacquers (not shown), the color centers 10 have the advantage that they act to impart color. In this way it is possible to match the color of the layer in which they are arranged to desired characteristics, for example specific colorations, by suitable selection of the substance(s) utilized as color centers 10.

The foregoing description and examples have been set forth merely to illustrate the invention and are not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An organic layer for subsequent coating with a cover layer which is harder than the organic layer, wherein said organic layer has an exposed surface provided with growth nuclei for the cover layer which is subsequently to be applied, said growth nuclei exhibiting $sp^2$ or $sp^3$ bonding orbital hybridization for elements of the cover layer.

2. An organic layer according to claim 1, wherein the growth nuclei are distributed uniformly on the exposed surface of the organic layer.

3. An organic layer according to claim 1, wherein said growth nuclei are selected from the group consisting of adamantane, congressane and organic molecules which contain corresponding homologs of $sp^2$ hybridizing carbon agglomerates.

* * * * *